(12) United States Patent
Goel et al.

(10) Patent No.: US 8,427,886 B2
(45) Date of Patent: Apr. 23, 2013

(54) MEMORY DEVICE WITH TRIMMABLE POWER GATING CAPABILITIES

(75) Inventors: Ankur Goel, Haryana (IN);
Venkateswara Reddy Konudula, Karnataka (IN); Sathisha Nanjunde Gowda, Karnataka (IN)

(73) Assignee: LSI Corporation, San Jose, CA (US)

( * ) Notice: Subject to any disclaimer, the term of this patent is extended or adjusted under 35 U.S.C. 154(b) by 156 days.

(21) Appl. No.: 13/180,499

(22) Filed: Jul. 11, 2011

(65) Prior Publication Data

US 2013/0016573 A1 Jan. 17, 2013

(51) Int. Cl.
*G11C 7/00* (2006.01)
(52) U.S. Cl.
USPC .................. 365/189.06; 365/226; 365/229
(58) Field of Classification Search ............. 365/189.06, 365/226, 229; 327/534
See application file for complete search history.

(56) References Cited

U.S. PATENT DOCUMENTS

| | | | |
|---|---|---|---|
| 7,079,426 B2 | 7/2006 | Zhang et al. | |
| 7,149,142 B1 * | 12/2006 | Fisher et al. | 365/229 |
| 7,362,646 B2 | 4/2008 | Otsuka et al. | |
| 7,764,547 B2 * | 7/2010 | Lee et al. | 365/185.17 |
| 7,894,292 B2 * | 2/2011 | Agari et al. | 365/229 |
| 2011/0007596 A1 | 1/2011 | Lee et al. | |

OTHER PUBLICATIONS

A. Nourivand et al., "An Adaptive Sleep Transistor Biasing Scheme for Low Leakage SRAM," Dept. of Electrical and Computer Engineering, Concordia University, Montreal, Quebec, Canada.
A. Goel et al., "Gate Leakage and Its Reduction in Deep Submicron SRAM," Proceeding of the 18th International Conference on VLSI Design, 2005, IEEE.
K. Zhang et al., "Low-Power SRAMs in Nanoscale CMOS Technologies," IEEE Transactions on Electron devices, Jan. 2008, pp. 145-151, vol. 55, No. 1, IEEE, Lausanne, Switzerland.

* cited by examiner

*Primary Examiner* — Son Dinh
(74) *Attorney, Agent, or Firm* — Otterstedt, Ellenbogen & Kammer, LLP

(57) ABSTRACT

A memory device includes at least one memory cell including a storage element electrically connected with a source potential line. A drive strength of the storage element is controlled as a function of a voltage level on the source potential line. The memory device further includes a clamp circuit electrically connected between the source potential line and a voltage source. The clamp circuit is operative to regulate the voltage level on the source potential line relative to the voltage source. A control circuit of the memory device is connected with the source potential line. The control circuit is operative to adjust the voltage level on the source potential line as a function of an operational mode of the memory device. A coarseness by which the voltage level on the source potential line is adjusted is selectively controlled as a function of at least a first control signal.

24 Claims, 5 Drawing Sheets

| Trim Option | | | VSSC Value (mV) FF,0.765V,125C | | |
|---|---|---|---|---|---|
| A | B | C | Mean | Sigma | Min. Value |
| 0 | 0 | 0 | 108 | 3 | 93 |
| 1 | 0 | 0 | 89 | 3 | 77 |
| 1 | 1 | 0 | 76 | 3 | 65 |
| 1 | 1 | 1 | 51 | 2 | 43 |

MEMORY DEVICE WITH TRIMMABLE POWER GATING CAPABILITIES

FIELD OF THE INVENTION

The present invention relates generally to electronic circuits, and, more particularly, to memory devices.

BACKGROUND OF THE INVENTION

As the feature sizes of metal-insulator-semiconductor (MIS) devices continue to shrink, the die-to-die and within-die variations in device parameters are continuously increasing. Process variations are particularly critical in semiconductor memory devices, where minimum geometry transistors are commonly utilized in order to conform to rigorous area constraints. Such process variations may impact both stability and leakage in the memory devices. For example, the static noise margin (SNM) of a static random access memory (SRAM) cell quantifies how much voltage noise is required at the cell's internal nodes to flip the cell's logic state. Previous results suggest that there may be almost a 30% variation in SNM with only a 10% variation in the threshold voltages and channel lengths of the transistors forming the SRAM.

"Power gating" is a technique for addressing the leakage of SRAM cells. In a conventional six-transistor (6T) MIS-based SRAM memory cell, the source terminals of the two n-type field effect transistors that form a portion of the cell's two cross-coupled inverters are usually fixed at ground potential (or VSS). When applying power gating to VSS, in contrast, this source voltage is instead varied based on the active/inactive state of the cell. More particularly, with power gating, the source voltage is raised to a "virtual ground" voltage above VSS while the SRAM memory cell is in standby mode, and returned to VSS during read and write operations. Varying the source voltage in this manner has been shown to decrease the leakage of the memory cell, but to also decrease its SNM. Accordingly, the optimum source voltage for the SRAM cell in standby mode may simply be the highest value that is allowed by the SNM.

SUMMARY OF THE INVENTION

The present invention, in illustrative embodiments thereof, relates to memory devices with power gating capabilities that may be finely trimmed on a memory-block-by-memory-block basis after the memory devices have been formed. To accomplish this, aspects of the invention utilize a power gating circuit that is electrically connected to source terminals of memory cells within a memory device. The power gating circuit sets the source potential low (e.g., ground potential or VSS) when a given memory block is in an operational mode, and sets the source potential to a value higher than ground (e.g., VSSC) when that memory block is in standby mode. While performing this function, various sub-circuits within the power gating circuit both limit the standby source potential and allow it to be trimmed to various values through the application of one or more trimming signals. The resultant power gating of the memory cells reduces their standby leakage currents and thereby reduces the standby leakage of the entire memory device.

In accordance with an embodiment of the invention, a memory device includes at least one memory cell including a storage element electrically connected with a source potential line. A drive strength of the storage element is controlled as a function of a voltage level on the source potential line. The memory device further includes a clamp circuit electrically connected between the source potential line and a voltage source. The clamp circuit is operative to regulate the voltage level on the source potential line relative to the voltage source. A control circuit of the memory device is connected with the source potential line. The control circuit is operative to adjust the voltage level on the source potential line as a function of an operational mode of the memory device. A coarseness by which the voltage level on the source potential line is adjusted is selectively controlled as a function of at least a first control signal. At least a portion of the power gating circuit may be implemented in one or more integrated circuits.

In accordance with another embodiment of the invention, a power gating circuit is provided for use with a memory device having at least one memory cell including a storage element electrically connected with a source potential line. The power gating circuit includes a clamp circuit electrically connected between the source potential line and a voltage source of the memory device. The clamp circuit is operative to regulate a voltage level on the source potential line relative to the voltage source. The power gating circuit further comprises a control circuit connected with the source potential line. The control circuit is operative to adjust the voltage level on the source potential line as a function of an operational mode of the memory device. A coarseness by which the voltage level on the source potential line is adjusted is selectively controlled by the control circuit as a function of at least a first control signal. At least a portion of the power gating circuit may be implemented in one or more integrated circuits.

In accordance with yet another embodiment of the invention, an electronic system includes at least one integrated circuit, the integrated circuit including at least one power gating circuit for use with a memory device having at least one memory cell including a storage element electrically connected with a source potential line. The power gating circuit includes a clamp circuit electrically connected between the source potential line and a voltage source of the memory device. The clamp circuit is operative to regulate a voltage level on the source potential line relative to the voltage source. The power gating circuit further includes a control circuit connected with the source potential line. The control circuit is operative to adjust the voltage level on the source potential line as a function of an operational mode of the memory device. A coarseness by which the voltage level on the source potential line is adjusted is selectively controlled by the control circuit as a function of at least a first control signal.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 4 shows a table of exemplary standby VSSC voltage levels corresponding to at least some logic states of trimming signals for a modeled memory block, according to an embodiment of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF THE INVENTION

The present invention, according to aspects thereof, will be described herein in the context of illustrative memory devices having trimmable power gating circuitry. It should be understood, however, that the present invention is not limited to these or any other particular circuit arrangements. Rather, the invention is more generally applicable to techniques for improving standby leakage and stability in memory devices, among other advantages. Moreover, it will become apparent to those skilled in the art given the teachings herein that numerous modifications can be made to the embodiments shown that are within the scope of the present invention. That is, no limitations with respect to the specific embodiments described herein are intended or should be inferred.

For the purpose of describing and claiming the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., MOSFETs), as well as those that do not. In addition, despite a reference to the term "metal" in the acronym MISFET, the term MISFET is also intended to encompass semiconductor field effect transistors wherein the gate is formed from a non-metal such as, for instance, polysilicon.

Although implementations of the present invention described herein may be implemented using p-channel MISFETs (hereinafter called "PFETs") and n-channel MISFETs (hereinafter called "NFETs"), as may be formed using a CMOS fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
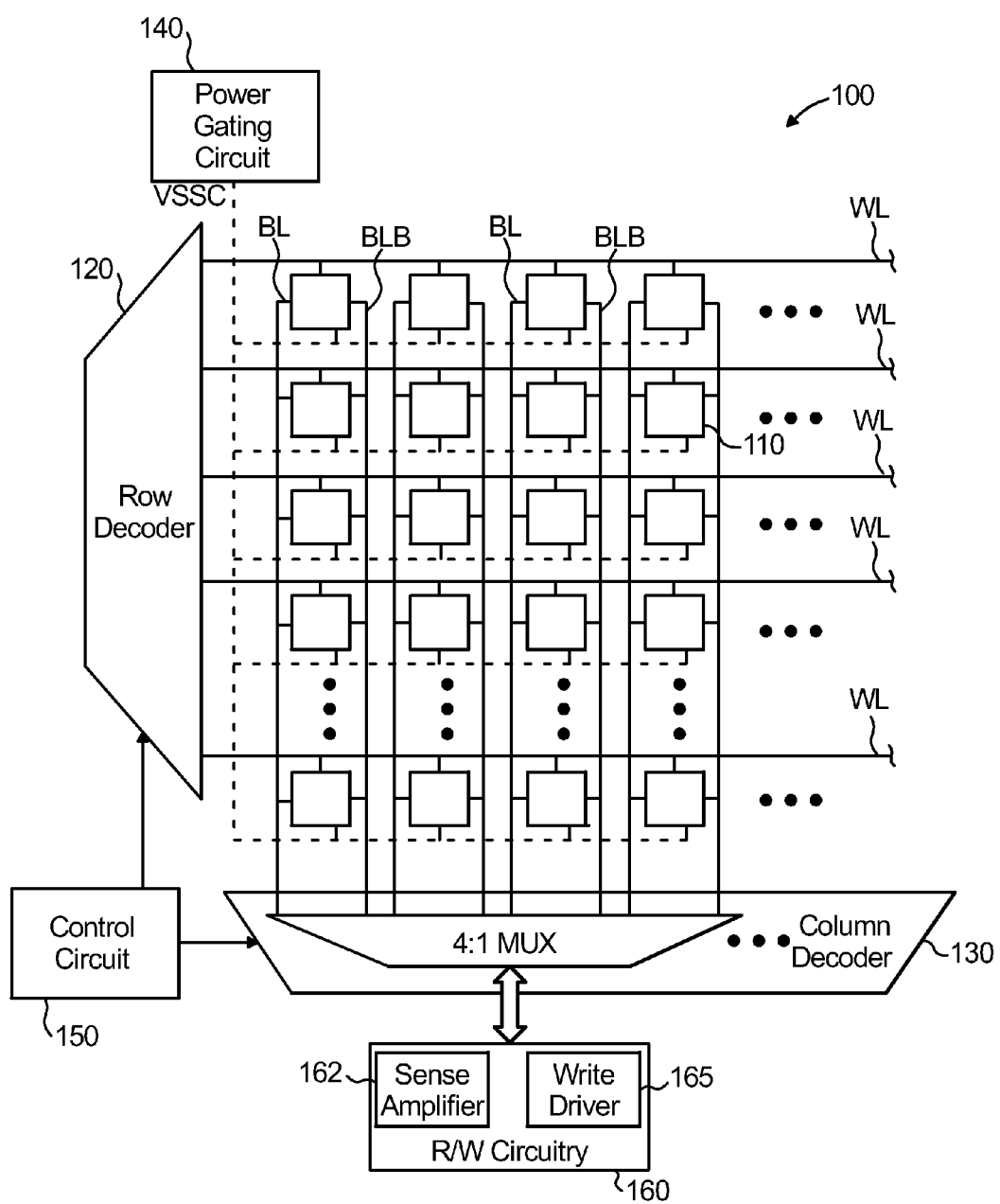
FIG. 1 shows a block diagram of at least a portion of an illustrative memory block in an SRAM device, according to an embodiment of the invention.

FIG. 1 shows a block diagram of an illustrative memory block 100 according to an embodiment of the invention. In this example, the memory block 100 is only one of several such blocks forming a larger memory device, in this particular case, an SRAM device. The memory block 100 preferably comprises a memory cell array and several peripheral circuits. The memory cell array includes a plurality of memory cells 110 arranged in a grid, although the invention is not limited to a grid configuration. The peripheral circuits include a row decoder 120, a column decoder 130, a power gating circuit 140, a control circuit 150, and read/write (r/w) circuitry 160. The r/w circuitry 160 comprises a sense amplifier 162 (for reading data stored in one or more memory cells) and a write driver 165 (for writing data to one or more memory cells). A plurality of word lines WL extend in the row direction of the memory block 100, while a plurality of bit lines BL and BLB extend in the column direction. Bit lines BL and BLB are generally logical complements of one another. Each memory cell 110 is preferably connected to a unique combination of one word line WL and one pair of complementary bit lines BL and BLB. Each memory cell 110 is also preferably connected to the power gating circuit 140.

Figure 2:
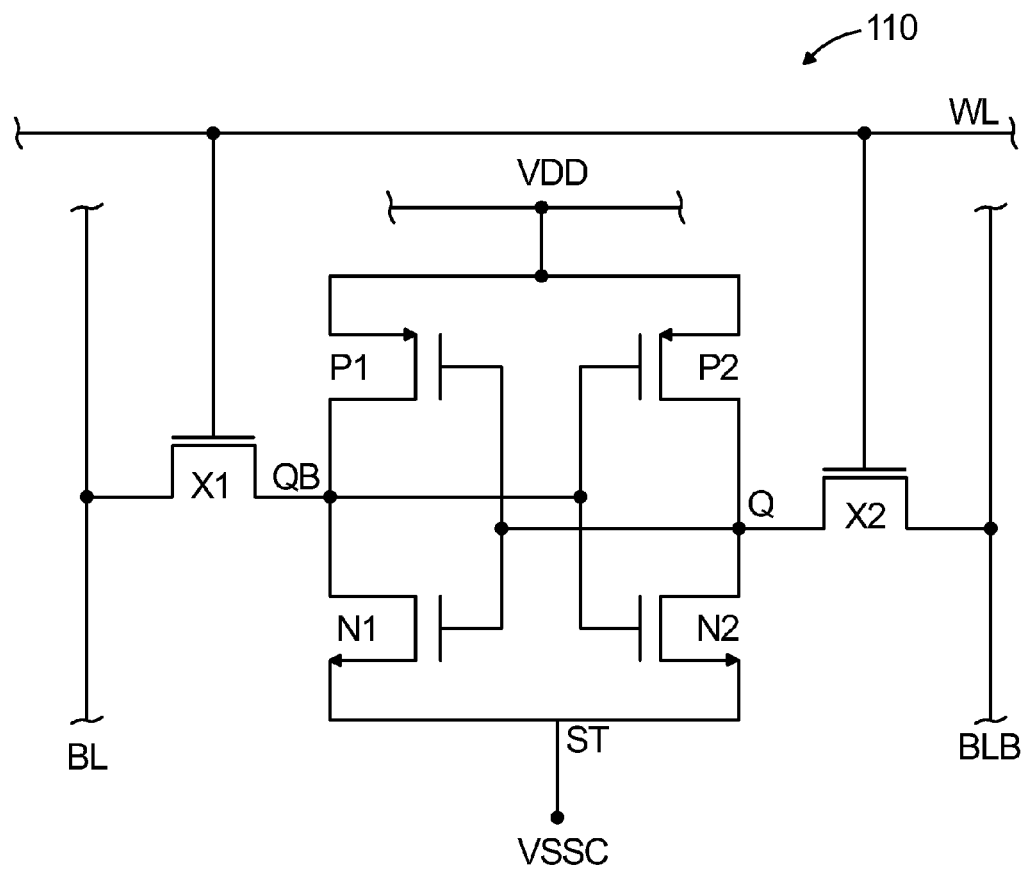
FIG. 2 shows a schematic of at least a portion of an illustrative memory cell that may reside within the FIG. 1 memory block, according to an embodiment of the invention.

FIG. 2 shows a schematic of at least a portion of an illustrative memory cell 110 that may reside within the FIG. 1 memory block 100, according to an embodiment of the invention. In this particular embodiment, the memory cell 110 includes two cross-coupled inverters which are operative as a storage element of the memory cell. The first inverter includes a PFET P1 and an NFET N1. A source (S) of the PFET P1 is preferably adapted for connection to a power supply source, which may be VDD. A drain (D) of PFET P1, on the other hand, is preferably connected to a drain of the NFET N1 via a memory node QB. Finally, a source of the NFET N1 is preferably connected to a source terminal node ST, which, in turn, is connected to the power gating circuit 140 (FIG. 1) and is at source potential VSSC.

In a similar manner, the second inverter in the illustrative memory cell 110 in FIG. 2 includes a PFET P2 and an NFET N2. Here, a source of the PFET P2 is adapted for connection to the power supply source VDD, while a drain of the PFET P2 is connected to a drain of the NFET N2 via a memory node Q. Lastly, a source of the NFET N2 is also preferably connected to the source terminal node ST at source potential VSSC.

In order to cross-couple the two inverters, gates (G) of the PFET P1 and the NFET N1 are preferably connected to the memory node Q, and gates of the PFET P2 and the NFET N2 are preferably connected to the memory node QB. In this manner, the output of the first inverter is connected to the input of the second inverter, while the output of the second inverter is connected to the input of the first inverter. Cross coupling inverters allows the memory cell 110 to act as a latch (i.e., flip-flop) with the ability to store complementary logic states at memory nodes Q and QB. In the present embodiment, the memory cell 110 is therefore of the static type. Between read and write operations (i.e., while the memory cell 110 is in a standby mode), the inverters reinforce each other and maintain the voltage levels on Q and QB so long as the inverters are connected to the supply potential source VDD.

In the present embodiment, the respective source terminal nodes ST of the memory cells 110 are preferably set at ground potential VSS when writing data to and reading data from the memory cells 110. Once so set, access (e.g., reading and/or writing data) to the memory cells 110 may, to a large degree, be regulated by transfer NFETs X1 and X2, or alternative switch elements (e.g., pass gates, etc.) also visible in FIG. 2. Transfer NFETs X1 and X2 preferably connect the first and second inverters to the corresponding bit lines BL and BLB, respectively. The gates of the NFET X1 and the NFET X2, moreover, are connected to a corresponding word line WL.

With continued reference to FIGS. 1 and 2, to write data to the memory cell 110, the bit lines BL and BLB may be chosen by the column decoder 130 and may be pre-charged by the write driver 165 to a state representative of the logic state to be stored. If a "0" logic state is to be stored, for example, the bit line BL may be set low (ground potential or VSS) and the complementary bit line BLB may be set high (power supply potential VDD). To write a "1" logic state, in contrast, the voltages of BL and BLB may be reversed. The word line WL corresponding to the particular memory cell 110 may then be asserted by the row decoder 120 to turn on transfer NFETs X1 and X2. Because the write driver 165 is much stronger than the transistors in the memory cell 110, charging the bit lines BL and BLB and asserting the word line WL in this manner ultimately results in the voltages on the bit lines BL and BLB being transferred to the internal storage nodes Q and QB in the selected memory cell 110.

In contrast, to read data from the memory cell 110, the bit lines BL and BLB may first be pre-charged by the write driver 165 to a high state and then allowed to float. Asserting the corresponding word line WL, in turn, causes the logic state on the internal storage nodes Q and QB of the selected memory cell 110 to be transferred to the bit lines BL and BLB. The sense amplifier 162 may then be used to determine whether bit line BL or bit line BLB has a higher potential and, correspondingly, which logic state was stored in the particular memory cell 110 being read.

Advantageously, the illustrative memory block 100 includes provisions for implementing a unique form of "power gating" in order to reduce standby leakage current while, at the same time, maintaining stability. To achieve this kind of power gating, the memory block 100 varies VSSC as a function of the memory block's mode of operation. As indicated earlier, for example, the memory block 100 preferably adjusts VSSC to a voltage potential about equal to VSS when the memory block 100 is actively performing read and write operations (i.e., when the memory block 100 is in an operational mode). In contrast, the memory block 100 preferably raises VSSC to a voltage potential greater than VSS, such as, for example, to an intermediate voltage between VSS and VDD, when the memory block 100 is in a standby mode (i.e., VSS<standby VSSC<VDD). The voltage level of VSSC can be used to control a bias voltage of the NFETs N1 and N2 in the cross-coupled inverters, thereby controlling a drive strength (e.g., gain, etc.) of the storage element in the memory cell 110. Ultimately, raising standby VSSC in this manner has the effect of reducing the voltage bias applied to the memory cells 110 in the memory block 100. With the reduced voltage bias, the leakage current of each of the memory cells 110 may be reduced in standby mode, and, correspondingly, the overall standby leakage current of the memory block 100 and the larger SRAM device may be substantially lowered.

Figure 3:
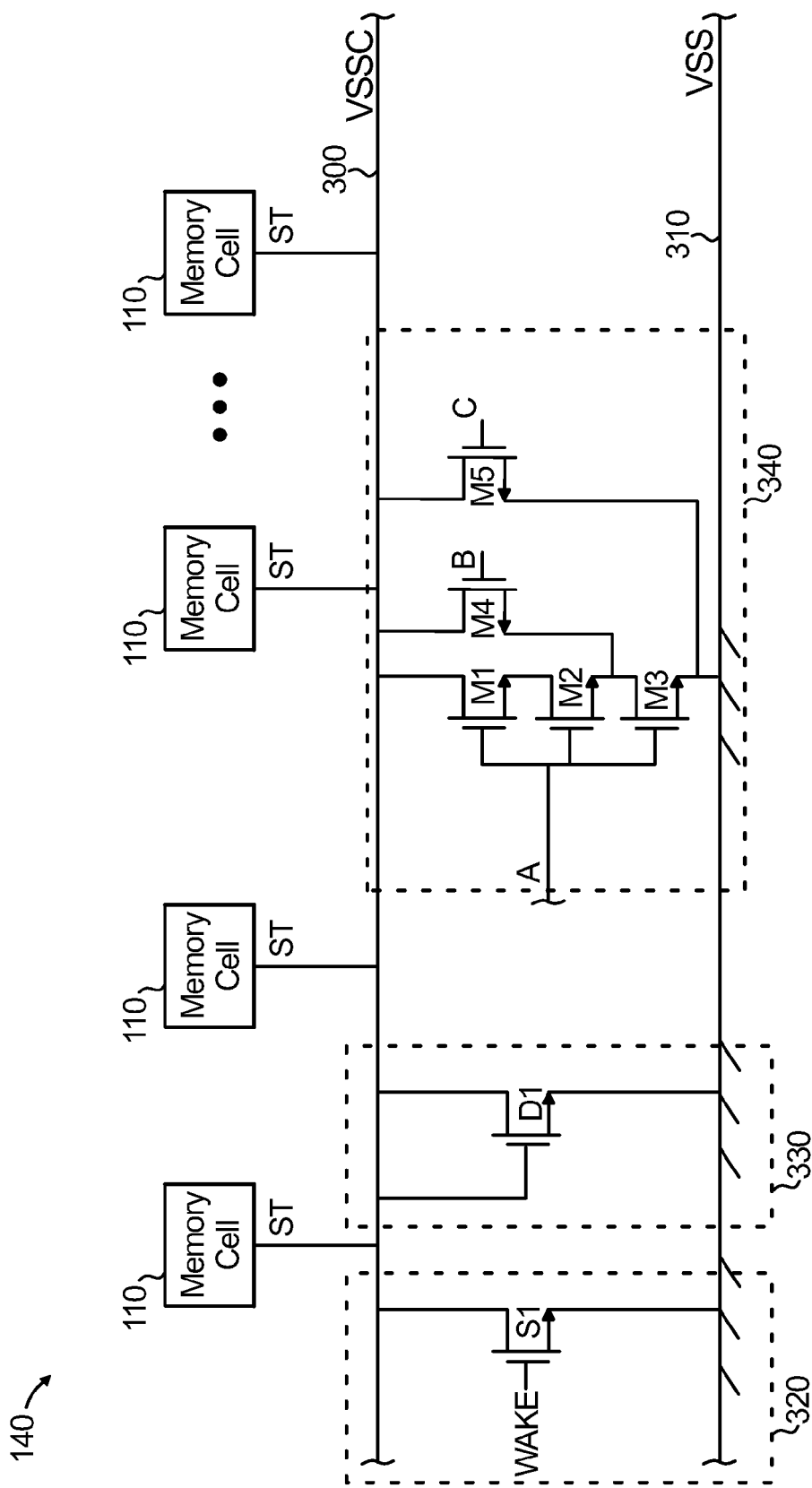
FIG. 3 shows a schematic of at least a portion of a power gating circuit that may reside in the FIG. 1 memory block, according to an embodiment of the invention.

Modulating VSSC within the memory block 100 in this manner may be performed by the power gating circuit 140. FIG. 3 shows a schematic of at least a portion of the power gating circuit 140 that may reside in the memory block 100, according to an embodiment of the invention. In this exemplary power gating circuit 140, the source terminal nodes ST from the respective memory cells 110 connect to a source potential line 300, which is at VSSC. A plurality of transistors, in turn, connects the source potential line 300 to a ground voltage source 310, which, in this particular embodiment, is fixed at VSS, although it may be at any other suitable potential. For purposes of understanding their function, the transistors forming the power gating circuit 140 may be separated into three functional sub-circuits: a mode control circuit, which may be a wake sub-circuit 320, a clamp circuit, which may be a diode sub-circuit 330, and a trimming sub-circuit 340. Each of these sub-circuits 320, 330, 340 is preferably connected between the source potential line 300 and the ground voltage source (VSS) 310. Moreover, each of these sub-circuits 320, 330, 340 is preferably arranged in parallel with one another, although alternative arrangements are similarly contemplated, according to other embodiments of the invention.

It is to be understood that, although shown herein as separate and distinct functional blocks, one or more aspects of the sub-circuits 320, 330 and 340 may be combined and/or integrated with one or more other functional circuits in the power gating circuit 140. For example, sub-circuits 320, 330 and 340 may be combined into a single control circuit which is operative to perform at least the functions of the individual sub-circuits.

The wake sub-circuit 320 preferably functions to pull down VSSC to VSS when the memory block 100 is in a first mode, which may be a memory access mode (i.e., when access to one or more memory cells is requested), and to allow VSSC to rise above VSS when the memory block 100 is in a second mode, which may be a standby mode (i.e., when access to the memory cells is not requested). In standby mode, VSSC may rise above VSS as a result of leakage current from the memory cells 110. In the present illustrative embodiment, the wake sub-circuit 320 is simply an NFET S1 which is activated (i.e., turned on and turned off) by a "wake" signal from the control circuit 150 (FIG. 1). When the memory block 100 is in a read or write mode, the wake signal is preferably asserted (e.g., high), causing the transistor, NFET S1, to switch on and to short the source potential line 300 to the ground voltage source 310. In contrast, when the memory block 100 is in standby mode, the wake signal is de-asserted (e.g., low) and the NFET S1 is turned off, electrically disconnecting the source potential line 300 from the ground voltage source 310. In the latter state, it is then the diode sub-circuit 330 and the trimming sub-circuit 340 that primarily act to regulate VSSC.

Like the wake sub-circuit 320, the diode sub-circuit 330 in the present illustrative embodiment also comprises a single NFET, in this case NFET D1. However, in the diode sub-circuit 330, the drain of the NFET D1 is shorted to its gate. This connection arrangement of the NFET D1 is often referred to as a diode-connected transistor configuration. As will be appreciated by one skilled in the art, a diode-connected NFET produces a drain current Ids that increases exponentially with the voltage on its gate and drain (Vg=Vd). When the voltage level on the source potential line 300 (the gate and drain of NFET D1) rises about a threshold voltage above VSS (a source of D1), the NFET D1 will turn on and begin conducting current Ids which serves to pull the source potential line toward VSS. This characteristic of the diode-connected NFET D1 has the property of clamping Vd relative to VSS. In the present configuration, the voltage on the gate and the drain of the NFET D1 is simply VSSC (i.e., Vg=VSSC). Accordingly, the diode sub-circuit 330 has a beneficial function to prevent VSSC from increasing without limit (i.e., floating).

Lastly, the trimming sub-circuit 340 comprises a plurality of variable resistance paths (i.e., trimming paths) connected in parallel between the source potential line 300 and VSS. The resistance in each path is preferably selectable as a function of respective control signals supplied to the trimming circuit 340. In this particular embodiment, the trimming circuit 340 comprises five NFETs M1-M5. NFETs M1-M3 are arranged in series and form a first trimming path between the source potential line 300 and the ground voltage source 310. The NFETs M1-M3, moreover, have their gates adapted to receive a trimming signal A, and are, consequently, collectively activated by the trimming signal A. An impedance (resistance) of this first trimming path will thus effectively be a series combination of the individual drain-to-source resistances of NFETs M1-M3. The fourth NFET, M4, in contrast, is arranged in parallel with NFETs M1 and M2, and in series with NFET M3 to form a second trimming path. NFET M4 has its gate adapted to receive a trimming signal B, and is therefore activated by the trimming signal B. Finally, NFET M5 is arranged in parallel with NFETs M1-M3 and M4 to form a third trimming path. NFET M5 has its gate adapted to receive a trimming signal C, and is therefore activated by the trimming signal C.

More particularly, a drain of NFET M1 is connected with the source potential line 300, a source of M1 is connected with a drain of NFET M2, a source of M2 is connected with a drain of NFET M3 at node N1, and a source of M3 is adapted for connection with the ground voltage source 310. Gates of M1, M2 and M3 are connected together and adapted to receive the trimming signal A. A drain of NFET M4 is adapted for connection with the source potential line 300, a source of M4 is connected with the source of M2 and the drain of M3 at node N1, and the gate of M4 is adapted to receive the trimming signal B. A drain of NFET M5 is adapted for connection with the source potential line 300, a source of M5 is adapted for connection with the ground voltage source 310, and a gate of M5 is adapted to receive the trimming signal C. NFETs M1-M5 can be formed of minimum size devices, thereby forming a switching matrix having a variable resistance which consumes significantly less IC area and power compared to other approaches.

The overall impedance between the source potential line 300 and VSS will be dependent upon which combination of trimming signals A, B and C are asserted/de-asserted at any given time. For example, when trimming signals A, B and C are all asserted (e.g., high or logic "1"), all NFETs M1-M5 will be turned on, thereby resulting in a signal combination having the lowest impedance. Conversely, when signals A, B and C are all de-asserted (e.g., low or logic "0"), NFETs M1-M5 will be turned off, and thus the impedance between the source potential line 300 and VSS will essentially be the highest of the signal combination. In this case, when the NFETs in trimming circuit 340 are all turned off, the impedance between the source potential line 300 and VSS will be established primarily by the diode sub-circuit 330 and any leakage attributable to the NFETs M1-M5.

In the present embodiment, the trimming signals A, B, and C are preferably separate and may be independently asserted by the memory block 100. The trimming signals may be, for example, generated by the control circuit 150. The ability to separately activate the NFETS M1-M3, the NFET M4, and the NFET M5 in this manner gives the trimming sub-circuit 340 the ability to finely adjust the standby VSSC voltage potential. FIG. 4, for example, shows a table of exemplary VSSC voltage levels for at least some corresponding logic states of the trimming signals A, B, and C, according to an embodiment of the invention. The values of VSSC are based on Monte Carlo analysis of a memory block similar to that shown in FIG. 1. As can be seen from the table, VSSC can be made to vary significantly by excluding the trimming sub-circuit 340 all together with the trimming signals set such that A=B=C=0, or by selectively connecting portions of the trimming sub-circuit 340. Standby VSSC with the trimming signals set such that A=1, B=0, and C=1 is about half of that which is achieved with the trimming signals set such that A=B=C=0. Additionally or alternatively, the impact of the trimming sub-circuit 340 on VSSC may also be modified by configuring one or more of the NFETs M1-M5 to produce only a weak inversion region when turned on. A weak inversion region frequently tends to produce a higher channel resistance.

While a particular arrangement of five MISFETs is shown for the trimming sub-circuit 340 in FIG. 3, this configuration is only meant to be illustrative. A purpose of the trimming sub-circuit 340 is to provide the memory block 100 with the capability to finely control standby VSSC through the use of separately assertable trimming signals, like trimming signals A, B, and C. One skilled in the art, upon understanding this purpose and given the teachings herein, will recognize that other arrangements of transistors (e.g., MISFETs), or alternative switching elements, can also achieve that function. In fact, adding additional MISFETs to the trimming sub-circuit 340 may result in even finer control of standby VSSC. Accordingly, these alternative embodiments would still come within the scope of the invention.

Figure 5:
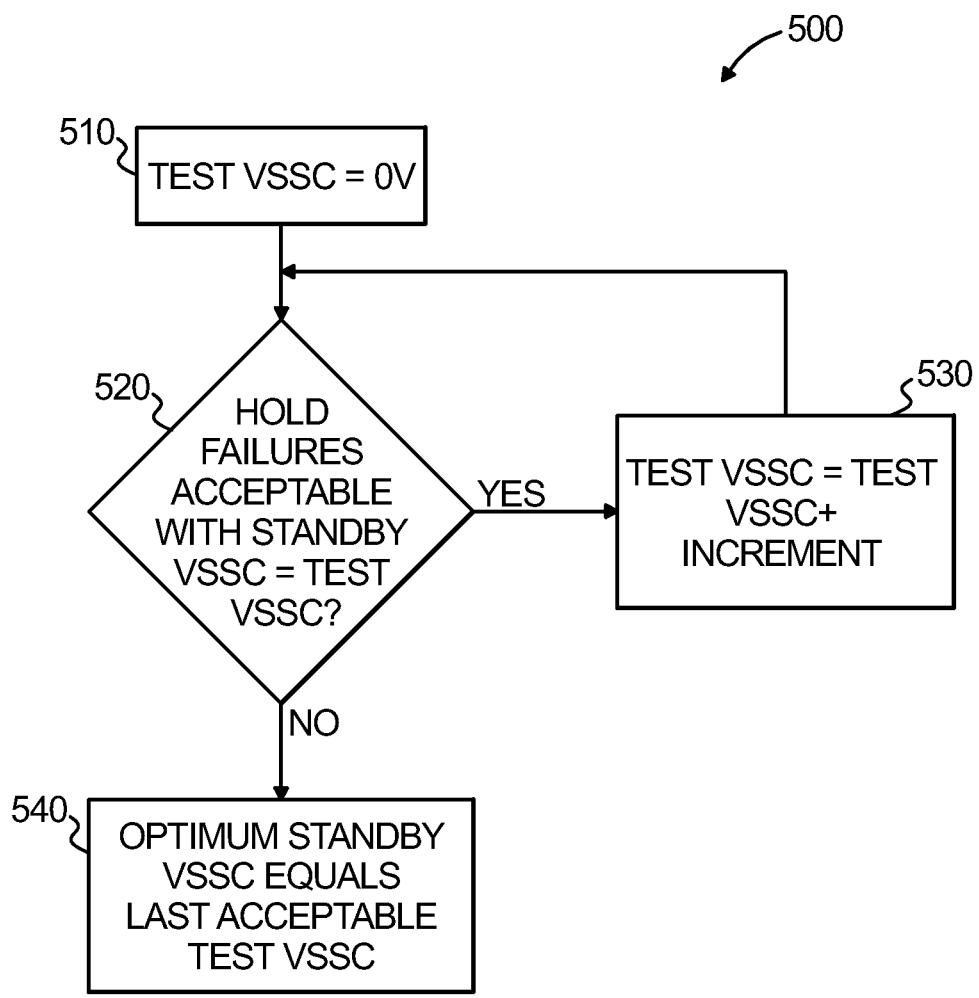
FIG. 5 shows a flow diagram of an illustrative method that may be used for determining the optimum standby VSSC for the FIG. 1 memory block, according to an embodiment of the invention.

With the exemplary circuitry described, it becomes possible to determine an optimum standby VSSC for the memory block 100 that achieves minimum standby leakage current while also achieving acceptable stability (e.g., acceptable SNM). FIG. 5 shows an illustrative method 500 for determining an optimum standby VSSC voltage for the memory block 100, in accordance with an embodiment of the invention. In step 510, a test VSSC is preferably initially set to VSS (e.g., 0 volt). Subsequently, in step 520, all the memory cells 110 in the memory block 100 are checked for "0" and "1" hold failures while using the test VSSC as the standby VSSC. If no hold failures are detected, the test VSSC voltage level is then incrementally raised (e.g., in 20 mV steps) in step 530. Subsequently, hold failures are again tested in step 520 using the higher VSSC voltage as the standby VSSC. This process (steps 520 and 530) is continued until eventually hold failures become unacceptable (e.g., a number greater than a prescribed threshold) in step 520. At that point, the optimum standby VSSC becomes the highest test VSSC for which hold failures were found to be acceptable, as indicated by step 540.

In this manner, the extent of power gating in a memory device in accordance with aspects of the invention may be finely adjusted on a memory-block-by-memory-block basis. Moreover, the adjustment may be done after the memory device is formed (i.e., post-manufacture), thereby allowing the power gating to take into account process variations. Power gating the memory device in this way both ensures the proper functioning of the memory device and substantially lowers standby leakage currents. Yield and performance may thereby be substantially enhanced.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1-3, or portions thereof, may be part of an integrated circuit. Integrated circuits so manufactured are considered part of this invention.

An integrated circuit in accordance with the present invention can be employed in essentially any application and/or electronic system in which a memory device is utilized. Suitable systems for implementing techniques of the invention may include, but are not limited to, personal computers, communication systems, electronic instruments (e.g., automated test equipment (ATE)), interface networks, high-speed memory interfaces (e.g., DDR3, DDR4), etc. Systems incorporating such integrated circuits are considered part of this invention.

It should again be emphasized that the above-described embodiments of the invention are intended to be illustrative only. Other embodiments may use different types and arrangements of elements for implementing the described functionality. As just one example, a skilled artisan will recognize that, in many circuit embodiments coming within the scope of the invention, a PFET may be substituted for an NFET and vice versa with only minor modifications to the circuit and no significant changes in functionality. These numerous alternative embodiments within the scope of the appended claims will be apparent to one skilled in the art given the teachings herein.

Moreover, the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

What is claimed is:

1. A memory device, comprising:
   at least one memory cell including a storage element electrically connected with a source potential line, a drive strength of the storage element being controlled as a function of a voltage level on the source potential line;
   a clamp circuit electrically connected between the source potential line and a voltage source, the clamp circuit being operative to regulate the voltage level on the source potential line relative to the voltage source; and
   a control circuit connected with the source potential line, the control circuit being operative to adjust the voltage level on the source potential line as a function of an operational mode of the memory device, a coarseness by which the voltage level on the source potential line is adjusted being selectively controlled by the control circuit as a function of at least a first control signal.

2. The memory device of claim 1, wherein the control circuit is operative to electrically connect the source potential line to the voltage source when the memory cell is in a first mode of operation, and to electrically disconnect the source potential line from the voltage source when the memory cell is in a second mode of operation.

3. The memory device of claim 2, wherein the control circuit is operative to set the source potential line at a first potential while the memory cell is in the first mode, and to set the source potential line at a second potential while the memory cell is in the second mode.

4. The memory device of claim 3, wherein the second potential is higher than the first potential.

5. The memory device of claim 2, wherein the first mode is a memory access mode of the memory device and the second mode is a standby mode of the memory device.

6. The memory device of claim 2, wherein the control circuit is operative to set the source potential line at a plurality of different potentials while the memory cell is in the second mode.

7. The memory device of claim 2, wherein the control circuit is operative to set the source potential line at four or more different potentials while the memory cell is in the second mode.

8. The memory device of claim 1, wherein the control circuit comprises a trimming circuit electrically connected between the source potential line and the voltage source, the trimming circuit comprising one or more first trimming transistors that are selectively activated by at least the first control signal.

9. The memory device of claim 1, wherein the clamp circuit comprises at least one MISFET connected in a diode configuration between the source potential line and the voltage source.

10. The memory device of claim 1, wherein the at least one memory cell is of a static type.

11. The memory device of claim 1, wherein the storage element in the at least one memory cell comprises two cross-coupled inverters forming a latch.

12. The memory device of claim 11, wherein each of the cross-coupled inverters comprises a MISFET having a source connected with the source potential line.

13. The memory device of claim 1, wherein the voltage source is fixed at a ground potential for the memory device.

14. The memory device of claim 1, wherein the coarseness by which the voltage level on the source potential line is adjusted is selectively controlled by the control circuit as a function of a plurality of digital control signals.

15. The memory device of claim 1, wherein the at least one control signal comprises a plurality of control signals, and wherein the control circuit comprises a trimming circuit including a plurality of variable resistance paths electrically connected between the source potential line and the voltage source, each of the variable resistance paths comprising at least one transistor activated by a given one of the plurality of control signals.

16. The memory device of claim 15, wherein at least a given one of the transistors in the trimming circuit is configured having a weak inversion region when the given transistor is turned on.

17. The memory device of claim 1, wherein the trimming circuit comprises:
   a first variable resistance path including one or more first trimming transistors activated by the first control signal and connected together in series between the source potential line and the voltage source; and
   at least a second variable resistance path including one or more second trimming transistors activated by a second control signal, at least one of the second trimming transistors being connected in parallel with at least one of the first trimming transistors.

18. The memory device of claim 17, wherein the memory device is operative to separately assert the first and second control signals.

19. The memory device of claim 17, wherein the trimming circuit comprises at least a third variable resistance path including one or more third trimming transistors activated by a third control signal, at least one of the third trimming transistors being connected in parallel with at least one of: (i) at least one of the first trimming transistors; and (ii) at least one of the second trimming transistors.

20. The memory device of claim 19, wherein the memory device is operative to separately assert the first, second and third control signals.

21. A power gating circuit for use with a memory device having at least one memory cell including a storage element electrically connected with a source potential line, the power gating circuit comprising:
   a clamp circuit electrically connected between the source potential line and a voltage source of the memory device, the clamp circuit being operative to regulate a voltage level on the source potential line relative to the voltage source; and
   a control circuit connected with the source potential line, the control circuit being operative to adjust the voltage level on the source potential line as a function of an operational mode of the memory device, a coarseness by which the voltage level on the source potential line is adjusted being selectively controlled by the control circuit as a function of at least a first control signal.

22. An electronic system, comprising:
at least one integrated circuit, the at least one integrated circuit including at least one power gating circuit for use with a memory device having at least one memory cell including a storage element electrically connected with a source potential line, the at least one power gating circuit comprising:
a clamp circuit electrically connected between the source potential line and a voltage source of the memory device, the clamp circuit being operative to regulate a voltage level on the source potential line relative to the voltage source; and
a control circuit connected with the source potential line, the control circuit being operative to adjust the voltage level on the source potential line as a function of an operational mode of the memory device, a coarseness by which the voltage level on the source potential line is adjusted being selectively controlled by the control circuit as a function of at least a first control signal.

23. An integrated circuit comprising at least one memory device, the at least one memory device comprising:
at least one memory cell including a storage element electrically connected with a source potential line, a drive strength of the storage element being controlled as a function of a voltage level on the source potential line;
a clamp circuit electrically connected between the source potential line and a voltage source, the clamp circuit being operative to regulate the voltage level on the source potential line relative to the voltage source; and
a control circuit connected with the source potential line, the control circuit being operative to adjust the voltage level on the source potential line as a function of an operational mode of the memory device, a coarseness by which the voltage level on the source potential line is adjusted being selectively controlled by the control circuit as a function of at least a first control signal.

24. The integrated circuit of claim 23, wherein the at least one memory device comprises a static random access memory.

* * * * *